(12) United States Patent
Anan et al.

(10) Patent No.: US 8,481,932 B2
(45) Date of Patent: Jul. 9, 2013

(54) CHARGED PARTICLE BEAM ANALYZER AND ANALYSIS METHOD

(75) Inventors: Yoshihiro Anan, Tokyo (JP); Masanari Koguchi, Kunitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/433,362

(22) Filed: Mar. 29, 2012

(65) Prior Publication Data

US 2012/0257720 A1    Oct. 11, 2012

(30) Foreign Application Priority Data

Apr. 8, 2011    (JP) .................................. 2011-086286

(51) Int. Cl.
*H01J 37/26*    (2006.01)
(52) U.S. Cl.
USPC .......................................... 250/306; 250/307
(58) Field of Classification Search
USPC ................. 250/305, 306, 307, 309, 310, 311, 250/308
See application file for complete search history.

(56) References Cited

U.S. PATENT DOCUMENTS

| | | | | |
|---|---|---|---|---|
| 5,812,631 | A | * | 9/1998 | Yan et al. .......................... 378/85 |
| 7,427,757 | B1 | * | 9/2008 | Janik et al. ..................... 250/310 |
| 2002/0158200 | A1 | * | 10/2002 | Terauchi ....................... 250/310 |
| 2011/0013744 | A1 | * | 1/2011 | Nicolosi et al. ................. 378/62 |

FOREIGN PATENT DOCUMENTS

| | | |
|---|---|---|
| JP | 2004-294168 | 10/2004 |
| JP | 2007-17350 | 1/2007 |
| JP | 2007-93316 | 4/2007 |

* cited by examiner

*Primary Examiner* — Nicole Ippolito
(74) *Attorney, Agent, or Firm* — Antonelli, Terry, Stout & Kraus, LLP.

(57) ABSTRACT

In a charged particle beam analyzer irradiating a charged particle beam to a sample in a vacuum container and detecting an X-ray generated from the sample to analyze the sample, two or more X-ray lenses configured in different manners are provided in the vacuum container. This no longer requires air opening in the vacuum container following X-ray lens replacement and also no longer requires vacuuming, making it possible to perform analysis with high efficiency and high sensitivity.

11 Claims, 7 Drawing Sheets

CHARGED PARTICLE BEAM ANALYZER AND ANALYSIS METHOD

CLAIM OF PRIORITY

The present application claims priority from Japanese patent application JP 2011-086286 filed on Apr. 8, 2011, the content of which is hereby incorporated by reference into this application.

BACKGROUND OF THE INVENTION

1. Technical Field of the Invention

The present invention relates to a charged particle beam analyzer and analysis method analyzing with high resolution and high sensitivity an element included in a sample by use of a charged particle beam.

2. Description of Related Arts

Known as an X-ray analysis technology in a nanometer-order region is an S(T)EM-EDX or an S(T)EM-WDX that divides an X-ray generated from a local region to which an electronic beam is irradiated while a microfine probe is scanned on a sample. (EDX; Energy Dispersive X-ray Spectroscopy, WDX; Wavelength Dispersive X-ray Spectroscopy). The S(T)EM-EDX or the S(T)EM-WDX is a equipment that has an energy-dispersive X-ray detector (EDX) or a wavelength dispersive X-ray detector (WDX) equipped with a scanning electron microscope (SEM) or a scanning transmission electron microscope (STEM). An X-ray division technology is disclosed in, for example, Japanese Patent Application Laid-open Publication No. 2004-294168, an X-ray focusing technology is disclosed in Japanese Patent Application Laid-Open Publication No. 2007-93316, and an X-ray analysis technology is disclosed in Japanese Patent Application Laid-Open No. 2007-17350.

The EDX detector uses as a detector a lithium drift silicon semiconductor detector or, in recent years, a silicon drift detector (SDD), and parallel detection can be performed by dividing with a multi-wave high spectroscope a pulse signal generated by the semiconductor detector. Used for the WDX is a detector that detects a diffraction grating for monochromatic and a monochromatic X-ray, thus resulting in serial detection that achieves detection while driving the diffraction grating and the detector. The WDX detector, compared to an energy resolution of 120 eV of the EDX detector, has an energy resolution of several electron Volts to several tens of electron Volts which is high by one digit or more, and avoids overlapping of X-ray spectra, thus permitting highly-sensitive analysis.

Figure 1:
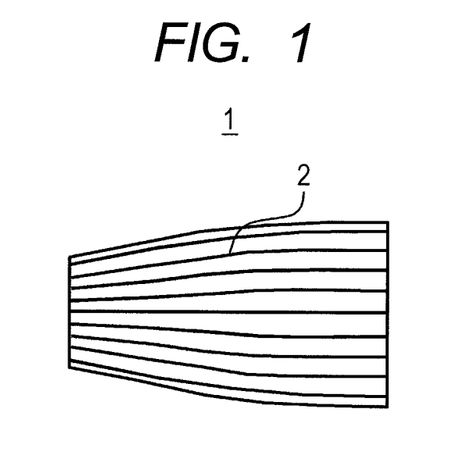
FIG. 1 is a schematic sectional view of a multi-capillary X-ray lens.
Figure 2:
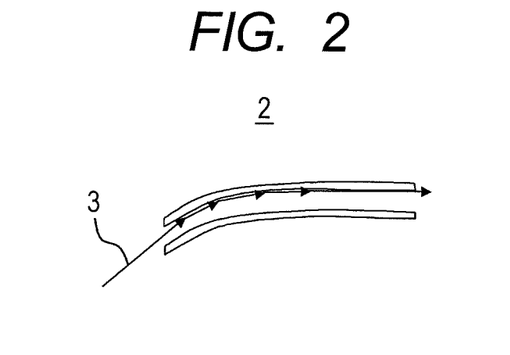
FIG. 2 is a schematic sectional view of a capillary illustrating an X-ray orbit inside of the capillary composing the multi-capillary X-ray lens.

Equipped with the WDX detector is an X-ray condensing lens called a multi-capillary X-ray lens 1 (or poli-capillary X-ray lens) shown in FIG. 1 for the purpose of detecting with a high yield X rays generated radially from a point of a sample to which an electronic beam has been irradiated (for example, Japanese Patent Application Laid-open Publication No. 2004-294168). The multi-capillary X-ray lens is structured to have several hundreds of thousands to several millions of glass tube (capillaries 2) with a diameter of approximately several um, and as shown in FIG. 2, an X-ray 3 entering into the capillary is discharged from a latter part surface of the multi-capillary X-ray lens 1 while repeatedly totally reflected in the capillary 2. Typically, the multi-capillary X-ray lens equipped with the WDX has discharge surface sides of the latter part of the multi-capillary X-ray lens 1 formed in parallel to each other as shown in FIG. 1 for the purpose of entrance of an X-ray parallel to the diffraction grating of a flat-plate shape.

SUMMARY OF THE INVENTION

As measures against trends towards higher resolution and higher sensitivity permitting X-ray analysis of a microelement (with a content of 1% or less), which seems to be increasingly demanded in future, have been studied. As described above, the WDX detector has excellent energy resolution, and thus the WDX detector has been further studied.

In the WDX detector, as described above, the X-ray 3 entering into the multi-capillary is discharged from the latter part surface of the multi-capillary X-ray lens while repeatedly totally reflected in the capillary 2. Condition for the total reflection is that an angle of the X-ray entering into the capillary 2 is equal to or smaller than a critical angle $\theta c$ shown by formula (1).

$$\theta c = 0.02 \times \sqrt{\rho}/E \qquad (1)$$

In formula (1), $\rho$ denotes a density (g/cc) of the capillary 2 and E denotes an energy (kV) of the X-ray. In a case where the X-ray enters at an angle greater than the critical angle $\theta c$, the X-ray is not reflected but absorbed by a capillary side wall, which results in deterioration in a yield of the X-ray. The current WDX is equipped with one multi-capillary X-ray lens of a shape and a material supporting from a light element with a low energy to a heavy element region with a high energy. However, one multi-capillary X-ray lens supports a wide range of X-ray energies, and accordingly the yield of the X-ray in each energy of the X-ray cannot be pulled to a maximum, resulting in an unsatisfactory yield. To pull the yield of the X-ray to a maximum, in accordance with the energy of the X-ray, it is required to use multi-capillary X-ray lenses 1 with different tapered shapes or multi-capillary X-ray lenses 1 of different materials (or with different densities) so that the X-ray entering into the multi-capillary X-ray lens becomes equal to or smaller than the critical angle $\theta c$.

In Japanese Patent Application Laid-Open Publication No. 2007-93316, a multi-capillary lens and an X-ray lens called a Fresnel zone plate are combined together and the Fresnel zone plate is set on an X-ray optical axis between an X-ray origin and the multi-capillary X-ray lens. The use of the Fresnel zone plate makes it possible to reduce an X-ray condensing point. The Fresnel zone plate is structured to have an X-ray transmitting material and an X-ray blocking material arranged in a concentric fashion. Intensity of a detected X-ray decreases by half since an X-ray blocking region occupies about half of an area.

In Japanese Patent Application Laid-Open No. 2007-17350, configuration is such that two diffraction gratings, one for a low element and the other for a heavy element, and two detectors are provided. The two diffraction gratings are set on an optical axis parallelized by a multi-capillary X-ray lens, providing a system capable of detecting the low element and the heavy element at the same time. However, the parallel X-rays radiated by the multi-capillary X-ray lens are divided into two for detection, and thus the amount of each detected X-ray decreases by half.

In the local region analysis technology using the S(T)EM-WDX equipment described above, the inventors of the present invention have found the following problem arising from advancement of higher resolution and higher sensitivity in future.

Specifically, as described above, in a case where one multi-capillary X-ray lens is used for the analysis, the configuration is not optimum for an energy of an X-ray, thus resulting in an unsatisfactory yield of the X-ray.

To provide a high yield of the X-ray as described above, a multi-capillary X-ray lens suitable for a target X-ray energy is used. Thus, it is required to replace the multi-capillary X-ray lens for each energy of the X-ray to be analyzed. Operation of the X-ray lens replacement takes several hours to a half day to open a vacuum of the S(T)EM-WDX equipment to air once, replace the multi-capillary X-ray lens, and perform vacuuming again.

Moreover, the air opening of the S(T)EM-WDX equipment following the replacement of the multi-capillary X-ray lens described above causes a problem that in the equipment in which the air has been opened once, a carbon-contaminated component adheres to inside of the S(T)EM-WDX equipment. This makes it difficult to detect an element with concentration as very low as less than 1% since the carbon-contaminated component becomes a background in the X-ray analysis. Further, it has been found that to reduce the amount of the contaminated component to an amount with which analysis of an element with a trace concentration of less than 1% can be performed, exhausting needs to be performed continuously for one month or several months or more after the multi-capillary X-ray lens replacement, thus resulting in greatly increased time loss.

It is an object of the present invention to provide a charged particle beam analyzer and a charged particle beam analysis method capable of analysis with high efficiency and high sensitivity in a micro region without depending on an energy of an X-ray.

The aforementioned and other objects and new features of the invention will be clarified by the description of this specification and the accompanying drawings.

A brief description of an outline of a representative of the invention disclosed in this application is as follows.

In a charged particle beam analyzer irradiating a charged particle beam to a sample in a vacuum container and detecting an X-ray generated from the sample to analyze the sample, two or more X-ray lenses configured in different manners are provided in the vacuum container.

Moreover, in a charged particle beam analysis method of irradiating a charged particle beam to a sample in a vacuum container and detecting an X-ray generated from the sample to analyze the sample, two or more X-ray lenses configured in different manners are provided in the vacuum container, and the analysis is performed by use of the X-ray lens in accordance with an energy of the X-ray.

Briefly describing effect provided by a representative of the present invention disclosed in this application, by providing two or more X-ray lenses configured in different manners in a vacuum container, a charged particle beam analyzer and a charged particle beam analysis method can be provided which are capable of analysis with high efficiency and high sensitivity in a micro region without depending on an energy.

DETAILED DESCRIPTION OF THE PREFERRED EMBODIMENTS

Hereinafter, the embodiments of the present invention will be described in detail with reference to the accompanying drawings. Note that in all the figures illustrating the embodiments, the same members are basically marked with the same numerals and their repeated description will be omitted.

(First Embodiment)

Figure 3:
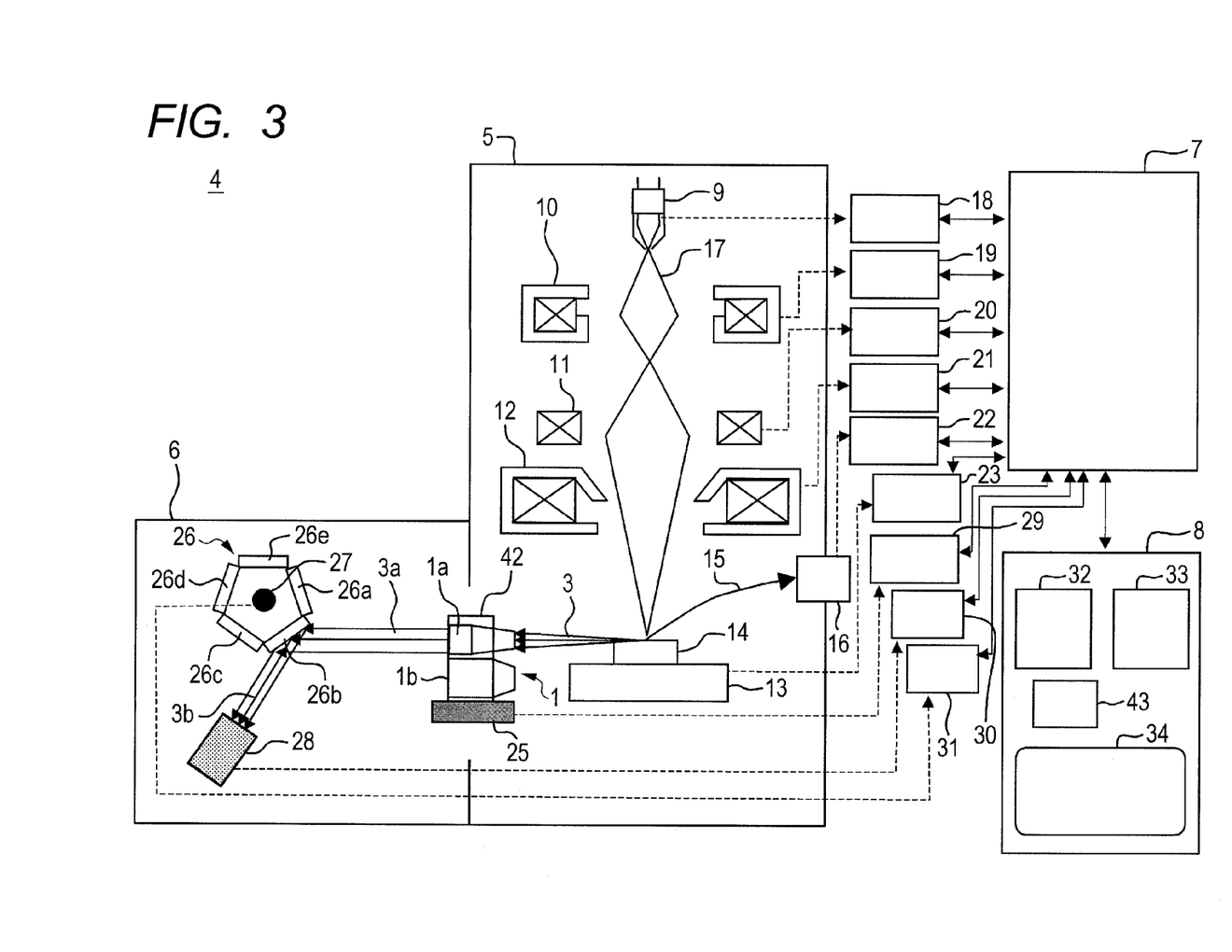
FIG. 3 is a schematic overall configuration diagram of a charged particle beam analyzer (electron beam analyzer) according to a first embodiment of the present invention.

Referring to FIGS. 3 to 10, a first embodiment will be described with reference to, as one example, an electron beam analyzer as one of charged particle beam analyzers, but an ion beam can be used instead of an electron beam. FIG. 3 is a schematic diagram showing an entire configuration example of the electron beam analyzer according to the first embodiment. The electron beam analyzer 4 is composed of: a scanning electron microscope 5, an X-ray analyzer 6, a control system 7, and an operation section 8.

The scanning electron microscope 5 is composed of: an electron gun 9, a condensing lens 10, an electron beam deflector 11, an objective lens 12, a sample stage 13, and a secondary electron detector 16. The X-ray analyzer 6 is composed of: X-ray lenses 1 (1a and 1b), diffracting gratings 26 (26a, 26b, 26c, 26d, and 26e), and an X-ray detector 28. The control system 7 is composed of: an electron gun control section 18, a condensing lens control section 19, an electron beam deflector control section 20, an objective lens control section 21, a secondary electron detection system circuit control section 22, a stage control section 23, an X-ray lens driving system control section 29, an X-ray detection system circuit control section 30, and a diffraction grating replacement section control section 31. The operation section 8 is composed of: an image display section 32, a spectrum display section 33, a storage section 43 storing multi-capillary X-ray lens position and diffraction grating selection condition; and an operation screen 34. Numeral 42 denotes an X-ray lens holding section, numeral 25 denotes an X-ray lens driving section, and numeral 27 denotes a diffraction grating replacement section.

Figure 4:
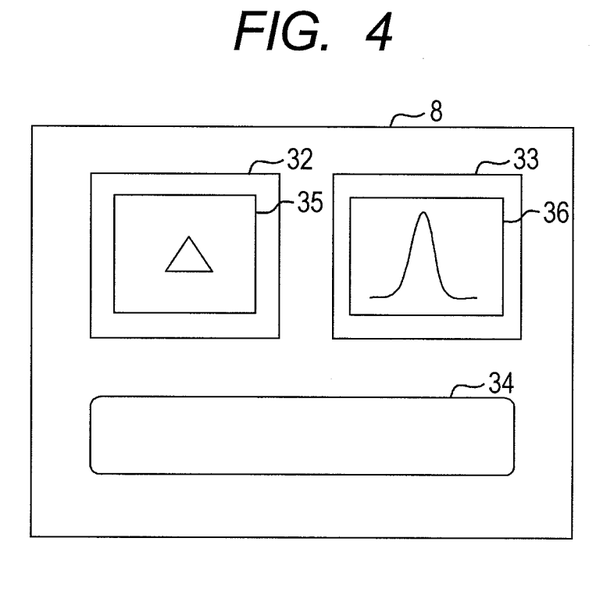
FIG. 4 is a diagram showing one example of an operation section of the charged particle beam analyzer (electron beam analyzer) according to the first embodiment of the invention.

A primary electron beam 17 generated from the electron gun 9 is irradiated to a diaphragm sample 14 with the objective lens 12, and also upon the irradiation to the sample 14, scanning speed and a scanned region are restricted by the electron beam deflector 11. In accordance with the scanning speed, a secondary electron 15 generated from a section where the primary electron beam 17 is irradiated is detected by the secondary electron detector 16. A secondary electron signal detected by the secondary electron detector 16 can be outputted in synchronization with a scanning signal of the primary electron beam 17 to thereby display a secondary electron image 35 of the sample 14 at the image display section 32, as shown in FIG. 4.

Figure 5:
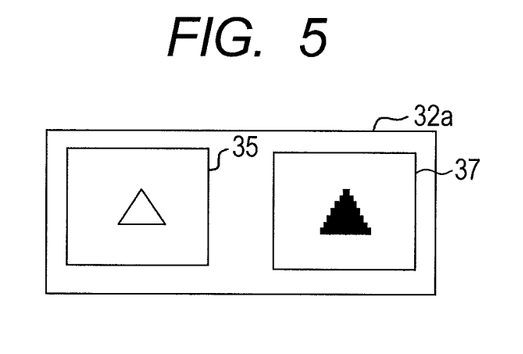
FIG. 5 is a diagram showing one example of an image display section in the operation section of the charged particle beam analyzer (electron beam analyzer) according to the first embodiment of the invention.

The X-ray analyzer 6 includes a wavelength dispersive X-ray detector (WDX), and takes in, with a multi-capillary X-ray lens 1, X-rays 3 generated from the section of the sample 14 where the primary electron beam 17 has been irradiated and turns them to parallel X-rays 3a by the multi-capillary X-ray lens 1. Next, the X-rays radiated from a latter part of the multi-capillary X-ray lens 1 are detected by the X-ray detector 28 after the X-rays 3a of parallel light are monochromatic by the diffraction gratings 26. The use of the diffraction gratings permits performing high-energy resolution analysis. Numeral 3b denotes the monochromatic X-ray. The detected X-ray, as shown in FIG. 4, displays a spectrum 36 at the spectrum display section 33. As with a case where the secondary electron image 35 is obtained, an X-ray signal detected by the X-ray detector 28 can be outputted in synchronization with the scanning signal of the primary electron beam 17 to thereby display an element map image 37 at the image display section 32. Switching image output of the image display section 32 also makes it possible to display the secondary electron image 35 or the element map image 37. Moreover, as shown in FIG. 5, two screens can be provided at an image display section 32a so that the secondary electron image 35 and the element map image 37 can be displayed simultaneously.

As a result of performing X-ray analysis of a microelement with a content of 1% or below by use of the electron beam analyzer of this embodiment, favorable results have been provided.

Figure 6:
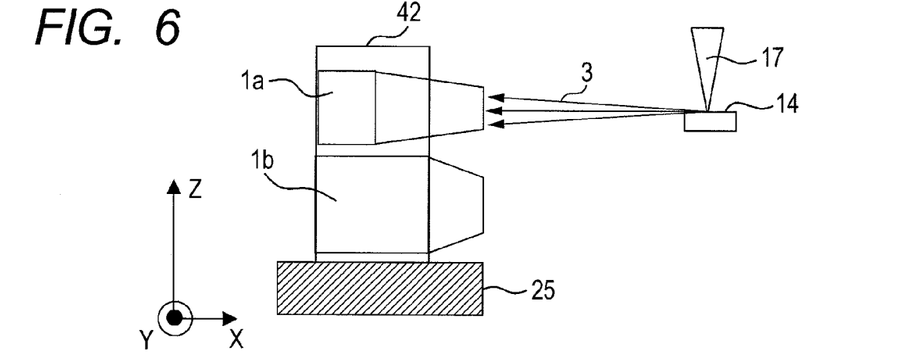
FIG. 6 is a side view illustrating an X-ray lens detection system forming part of the charged particle beam analyzer (electron beam analyzer) according to the first embodiment of the invention.

Provided in a vacuum container of the X-ray analyzer 6 in this X-ray analyzer are plural multi-capillary X-ray lenses 1 each composed of plural capillaries. FIG. 3 describes the two multi-capillary X-ray lenses 1a and 1b with different tapered angles for convenience, but the number of multi-capillary X-ray lenses is not limited to two, and it is desirable that two or more multi-capillary X-ray lenses configured in different manners be set. FIG. 6 shows a side view of the multi-capillary X-ray lens 1a and the multi-capillary X-ray lens 1b shown in FIG. 3. The multi-capillary X-ray lens 1a corresponds to a high-energy X-ray, and the multi-capillary X-ray lens 1b corresponds to a low-energy X-ray. In a case where materials of the capillaries 2 are the same, based on Formula (1), a critical angle of the high-energy X-ray is small, and on the contrary, a critical angle of the low energy X-ray is large.

As described above, the X-ray 3 entering into a side wall of the capillary 2 at an angle equal to or smaller than the critical angle, as shown in FIG. 2, is discharged from the latter part of the multi-capillary X-ray lens 1 while repeatedly reflected in the capillary 2. However, the X-ray 3 entering into the capillary 2 at an angle larger than the critical angle breaks in the side wall and is absorbed by the side wall, and thus is not discharged from the latter part of the multi-capillary X-ray lens 1. That is, to increase the volume of X-rays discharged from the latter part surface of the multi-capillary X-ray lens 1, the multi-capillary X-ray lens 1a with the small tapered angle is suitably used for the high-energy X-ray with the small critical angle and the multi-capillary X-ray lens 1b with the large tapered angle is suitably used for the low-energy X-ray with the large critical angle. Here, due to the assumption that the multi-capillary X-ray lenses 1 with the same density (formed of the same material) are used, the multi-capillary X-ray lenses with the different tapered angles are used here, but the multi-capillary X-ray lenses formed of different materials may be used. Used as an X-ray lens in this embodiment is a multi-capillary but a zone plate can also be used.

Figure 7:
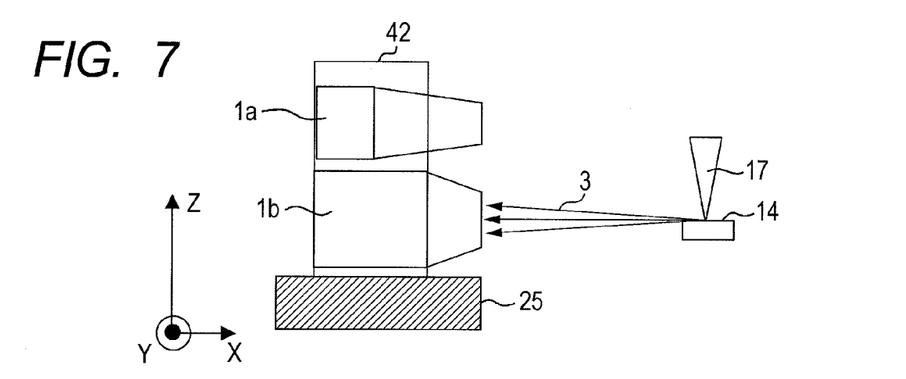
FIG. 7 is a side view illustrating the X-ray lens detection system forming part of the charged particle beam analyzer (electron beam analyzer) according to the first embodiment of the invention.

In a case where an X-ray to be measured has a high energy, as shown in FIG. 6, by use of the X-ray lens driving section 25, the multi-capillary X-ray lens 1a with the small tapered angle which is applied to the high-energy X-ray is set at a center of an X-ray optical axis of the X-rays 3. On the contrary, in a case where the X-ray to be measured has a low energy, as shown in FIG. 7, by use of the X-ray lens driving section 25, the multi-capillary X-ray lens 1b with the large tapered angle which is applied to the low-energy X-ray is set at the center of the X-ray optical axis of the X-rays 3. With the configuration of this embodiment, the X-ray lens holding section and the X-ray lens replacement section are integrated. Moreover, the diffraction grating to be used is replaced in accordance with the energy of the X-ray to be measured. For example, the diffraction gratings 26a to 26e can be suited for low energy X-rays (for light elements) to high energy X-rays (for heavy elements). In this case, when the multi-capillary X-ray lens 1a is used, any of the diffraction gratings 26c to 26e is selected, and when the multi-capillary X-ray lens 1b is used, any of the diffraction gratings 26a to 26c is selected. Where the number of multi-capillary X-ray lenses is M and the number of diffraction gratings is N, it is desirable that $N \geq M$.

Figure 8:
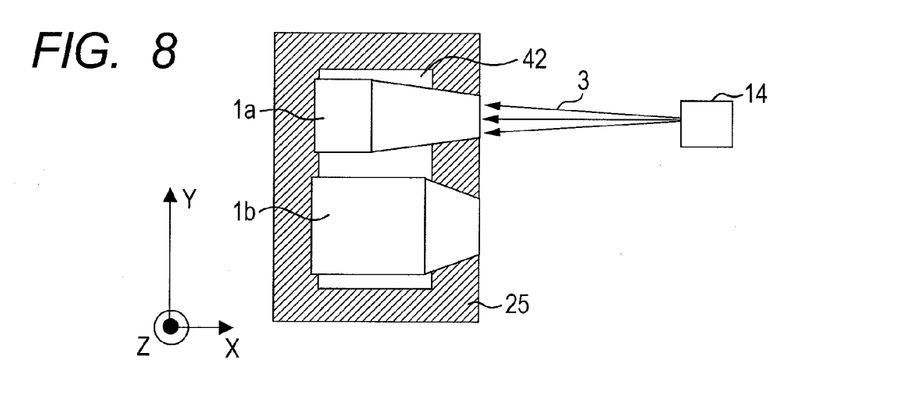
FIG. 8 is a top view illustrating the X-ray lens detection system forming part of the charged particle beam analyzer (electron beam analyzer) according to the first embodiment of the invention.

As shown in FIGS. 6 and 7, each of the multi-capillary X-ray lenses 1a and 1b is arranged perpendicularly to a Z-axis defined as a direction of entrance from the primary electron beam 17 to the sample 14. Moreover, as shown in FIG. 8, where a direction in which the sample 14 is viewed from the multi-capillary X-ray lens 1 is an X-axis, the multi-capillary X-ray lens 1 may be arranged in a Y-direction perpendicular to an X-Z plane of the Z-axis as the direction of entrance from the primary electron beam 17 to the sample 14. The plural multi-capillary X-ray lenses 1 are arranged in any manner on a plane (Y-Z plane) perpendicular to the X-ray optical axis of the X-rays 3 as long as the multi-capillary X-ray lenses 1 do not overlap with each other on the X-ray optical axis. Distance of the X-ray lens from the sample can be changed by, for example, bringing the X-ray lens closer to the sample by the X-ray lens driving section 25 or a separately provided driving section.

Figure 9:
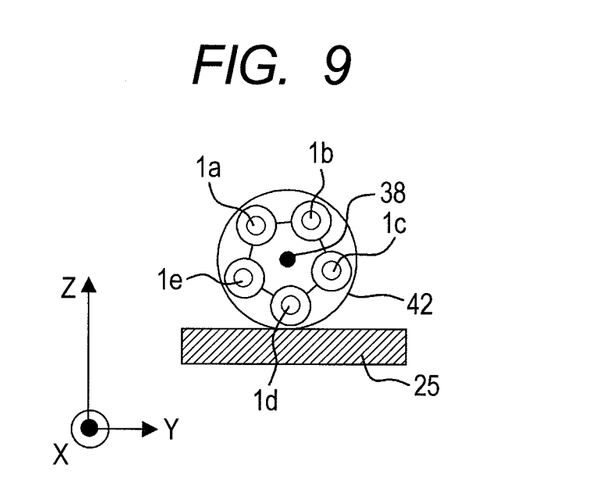
FIG. 9 is an elevation view illustrating the X-ray lens detection system forming part of the charged particle beam analyzer (electron beam analyzer) according to the first embodiment of the invention.
Figure 10:
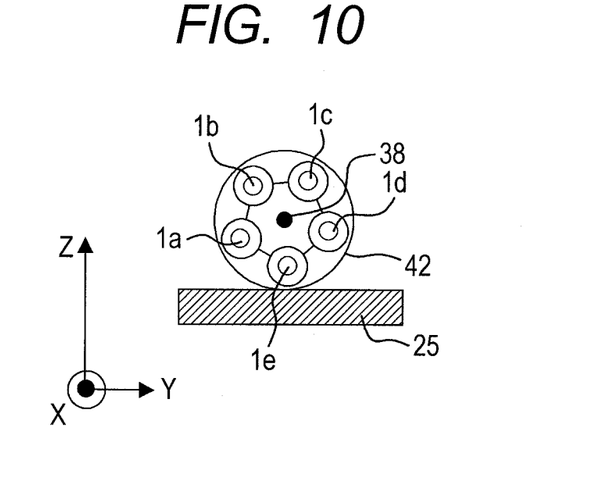
FIG. 10 is an elevation view illustrating the X-ray lens detection system forming part of the charged particle beam analyzer (electron beam analyzer) according to the first embodiment of the invention.

What is shown in FIG. 9 is a lens holding section 42 of a circular shape which is provided on the X-ray lens driving section 25 and which includes five multi-capillary X-ray lenses 1a, 1b, 1c, 1d, and 1e configured in different manners. Position of the five multi-capillary X-ray lenses can be changed as shown in FIG. 10 by rotating an X-ray lens replacement axis 38. For example, by rotating the X-ray lens replacement axis 38, the multi-capillary X-ray lens 1b shown in FIG. 10 is moved to and set at a section of the multi-capillary X-ray lens 1a shown in FIG. 9. In this case, for X-ray optical axis adjustment, as a result of previously setting the multi-capillary X-ray lens 1a shown in FIG. 9 at the center of the X-ray optical axis of the X-rays 3 by the X-ray lens driving section 25, it is possible to set any of the other multi-capillary X-ray lenses 1b to 1e at the center of the X-ray optical axis only by rotating the X-ray lens replacement axis 38 after the aforementioned previous setting. Setting the five multi-capillary X-ray lenses makes it possible to assign the five diffraction gratings in one-to-one correspondence with the multi-capillary X-ray lenses, thus improving sensitivity of the X-ray analysis.

X-ray analysis of a microelement with a content of 1% or less has been performed by use of the electron beam analyzer having the five multi-capillary X-ray lenses set therein, and favorable results have been provided.

The multi-capillary X-ray lenses 1 are set perpendicularly to the Z-axis for the entrance from the primary electron beam 17 to the sample 14, but this is because the diffraction gratings 26 are set perpendicularly to the Z-axis, and they are not necessarily set perpendicularly to the Z-axis. The multi-capillary X-ray lenses are set in any manner as long as they are perpendicular onto an axis linking together the sample 14 and the diffraction gratings 26, and it is needless to say that a change in setting condition of the diffraction gratings 26 results in a change in setting position of the multi-capillary X-ray lenses 1 accordingly.

This embodiment makes it possible to select, by the multi-capillary X-ray lens replacement section, the multi-capillary X-ray lens corresponding to the X-ray to be analyzed and also to provide X-ray intensities with high yields respectively in accordance with X-rays with different energies. Moreover, the multi-capillary X-ray lens can be selected by the lens replacement section and the X-ray lens driving section without air opening; therefore, air opening conventionally required for replacing the multi-capillary X-ray lens, lens replacement operation, and re-vacuuming are no longer required.

Furthermore, since the air opening of an S(T)EM-WDX equipment required for the multi-capillary X-ray lens replacement operation is not required, a contaminated component resulting from the air opening no longer adheres. Thus, it has been conventionally required to continuously provide an evacuated state for several months after vacuuming for the purpose of preventing the contaminated component from having an influence on trace detection, but this is no longer required, making it possible to perform detection of an element with trace concentration in a short term.

As described above, this embodiment can provide a charged particle beam analyzer capable of analysis with high efficiency and high sensitivity in a micro region without depending on an energy of an X-ray.

(Second Embodiment)

Figure 11:
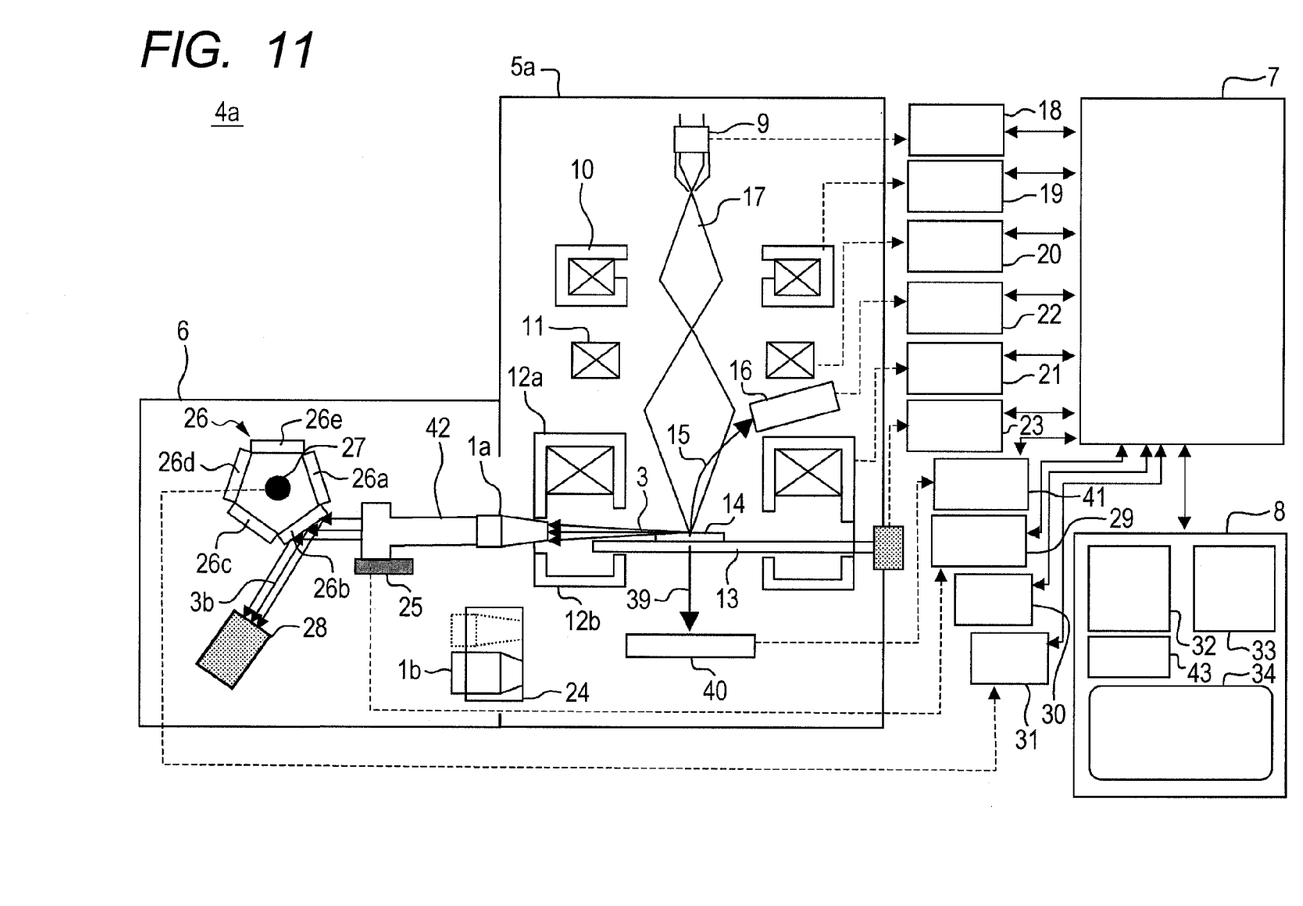
FIG. 11 is a schematic overall configuration diagram of a charged particle beam analyzer (electron beam analyzer) according to a second embodiment of the invention.

The second embodiment will be described with reference to FIG. 11. Note that items described in the first embodiment but not described in this embodiment can also be applied to this embodiment unless otherwise specified. FIG. 11 is a schematic overall configuration diagram of a charged particle beam analyzer (electron beam analyzer 4a in this embodiment) according to this embodiment. This embodiment will be described, referring to an example in which an X-ray analyzer is equipped with a scanning transmission electron microscope. FIG. 11 shows the X-ray analyzer 6 equipped with the scanning transmission electron microscope 5a.

Basic configuration is the same as that of the X-ray analyzer 6 (shown in FIG. 3) equipped with the scanning electron microscope 5. In case of the scanning transmission electron microscope 5a, in addition to the secondary electron detector 16 that detects the secondary electron 15 in the scanning electron microscope 5, a transmitted-scattered electron detector 40 that detects an electron 39 transmitted through and scattered in a sample 14 as a result of irradiating a primary electron beam 17 to the sample 14 is set below the sample 14. A signal obtained by the transmitted-scattered electron detector 40 is subjected to signal processing at a transmitted-scattered electron detection system circuit section 41. A transmitted-scattered electron signal detected by the transmitted-scattered electron detector 40 can be outputted in synchronization with a scanning signal of the primary electron beam 17 to thereby display a transmitted-scattered electron image 44 (not shown) of the sample 14 at an image display section 32. Typically, intensity of the scattered electron is proportional to an atom number (Z) included in the sample, and thus the image is called a Z contrast image.

In the scanning transmission electron microscope 5a, as shown in FIG. 11, an objective lens is composed of an upper magnetic pole 12a and a lower magnetic pole 12b, and a multi-capillary X-ray lens 1a that takes in X-rays is set between the upper magnetic pole 12a and the lower magnetic pole 12b of the objective lens. Space between the upper magnetic pole 12a and the lower magnetic pole 12b of the objective lens is limited; therefore, as shown in FIG. 11, adopted configuration is such that an X-ray lens replacement section 24 and an X-ray lens driving section 25 are separated from each other. That is, the configuration is such that the X-ray lens used for the analysis can be moved separately from the other X-ray lenses not in use, which makes it easy to achieve movement to a narrow region and approach to the sample. With the configuration of this embodiment, the X-ray lens holding section and the X-ray lens replacement section are separated from each other. Moreover, a lens holding section 42 is hollow-structured so that X-rays discharged from a lower part of the multi-capillary X-ray lens 1a is transmitted through the lens holding section 42. For X-ray lens replacement, the multi-capillary X-ray lens 1a is moved to the X-ray lens replacement section 24 by the X-ray lens driving section 25 to replace it with the multi-capillary X-ray lens 1b. That is, also in this device, operation of replacement of the multi-capillary X-ray lens 1a with the multi-capillary X-ray lens 1b can be carried out within a vacuum.

Thus, as is the case with the first embodiment, also in the device having the X-ray analyzer 6 equipped with the scanning transmission electron microscope 5a, it is possible to provide X-ray intensities with high yields respectively in accordance with X-rays with different energies. Moreover, it is no longer required to perform air opening following lens replacement operation, the lens replacement operation, and re-vacuuming. Further, a contaminated component resulting from the air opening no longer adheres, making it possible to perform detection of an element with trace concentration in a short term.

This embodiment can provide the same effect as is provided by the first embodiment. Moreover, providing the configuration such that the X-ray lens used for the analysis can be moved separately from the other X-ray lenses not in use makes it possible to achieve movement to a narrow region and makes it easy to achieve approach to the sample.

(Third Embodiment)

Figure 12:
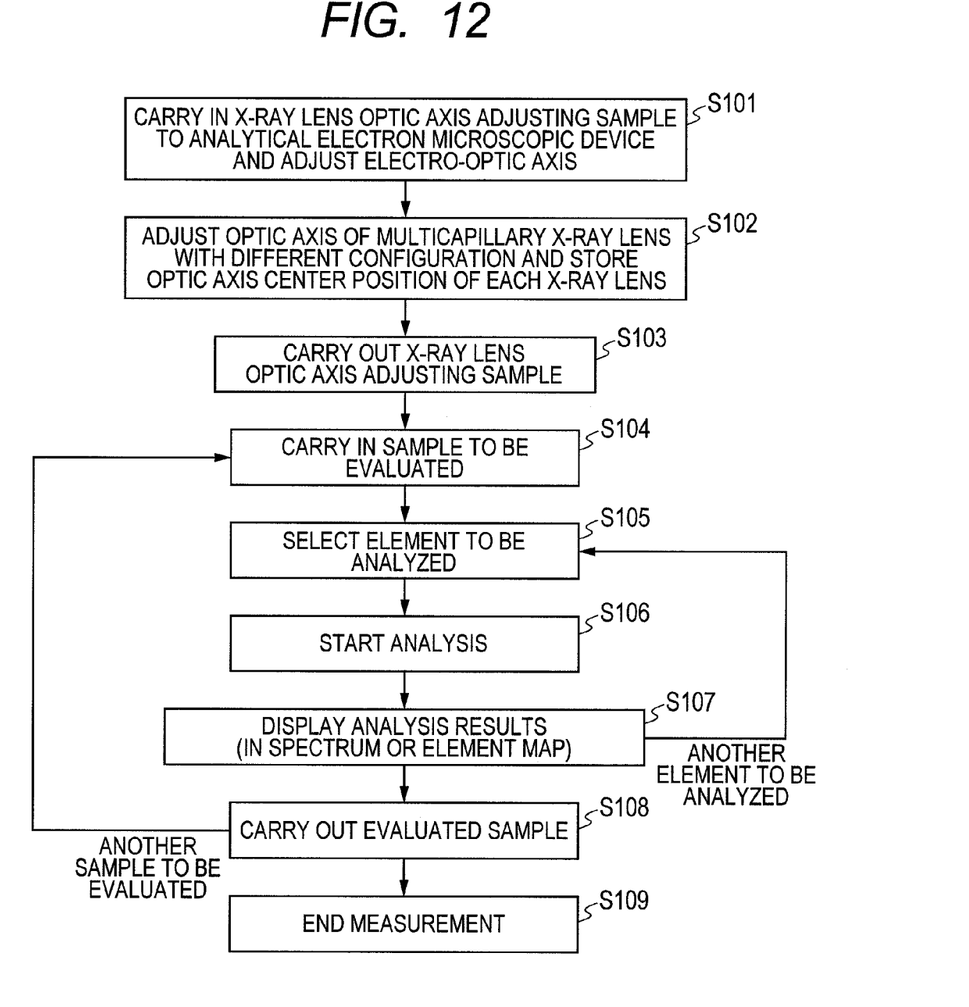
FIG. 12 is a flow chart showing an X-ray analysis method using the charged particle beam analyzer (electron beam analyzer) shown in FIG. 3.

A third embodiment will be described, referring to FIG. 12. Items described in the first or second embodiment but not described in this embodiment can also be applied to this embodiment unless otherwise specified. An X-ray analysis method using an electron beam analyzer (analytical electron microscopic device) having the X-ray analyzer (shown in FIG. 3) equipped with a scanning electron microscope according to this embodiment will be described, referring to a flow chart of FIG. 12.

First, an X-ray optical axis adjusting sample 14a (not shown) of multi-capillary X-ray lenses 1 (1a and 1b) is carried into an analytical electron microscopic device 4 to perform axis adjustment of an electronic optical system of a primary electron beam 17 (S101). To perform optical axis adjustment of the multi-capillary X-ray lenses 1 (1a and 1b) for each energy of an X-ray, used as the X-ray optical axis adjusting sample 14a is a sample containing a large number of known elements with high concentration.

Next, X-ray optical axis adjustment of the multi-capillary X-ray lenses 1 (1a and 1b) configured in different manners is performed (S102). Described here is an example of the X-ray optical axis adjustment of the multi-capillary X-ray lenses 1 (1a and 1b) configured in different manners. For example, in a case where a sample containing a heavy element A is used, the multi-capillary X-ray lens 1a formed with the small tapered angle shown in FIG. 3 is set onto a X-ray optical axis by a X-ray lens driving section 25. Moreover, a diffraction grating 26d highly sensitive to the heavy element A is set onto the X-ray optical axis by a diffraction grating replacement section 27. Then in a state in which X-rays 3 are generated as a result of irradiating an electron beam to the X-ray optical axis adjusting sample 14a, while the multi-capillary X-ray lens 1a is arbitrarily moved in X-, Y-, and Z-directions shown in FIG. 7, X-ray intensity for the heavy element A is measured with an X-ray detector 28. Position at which the X-ray intensity has become maximum as a result of the movement of the multi-capillary X-ray lens 1a is condition for arrival of the multi-capillary X-ray lens 1a at a center of the X-ray optical axis. Position of the multi-capillary X-ray lens 1a and a kind of the diffraction grating 26d when an X-ray signal volume has become maximum described above are stored into a storage section 43. Next, optical axis adjustment of the multi-capillary X-ray lens 1b configured differently is performed. The same operation as the adjustment of the multi-capillary X-ray lens 1a described above is performed and position of a center of the X-ray optical axis of the multi-capillary X-ray lens 1b and a kind of the diffraction grating 26a are stored into the storage section 43. The operation described above for the axis adjustment is performed for each of the multi-capillary X-ray lenses 1 configured in the different manners for the different elements and position of an X-ray optical axis and a kind of the diffraction grating are stored.

Next, the multi-capillary X-ray lens 1 optical axis adjusting sample is carried out (S103), and the sample 14 to be analyzed is carried into the electron beam analyzer 4 (S104).

Next, an element to be analyzed is selected on an operation screen 34 (S105). Based on the element selected at this time, the condition stored in the aforementioned step (S102) is read out, and the multi-capillary X-ray lens and the diffraction grating corresponding to the element are selected. Moreover, the multi-capillary X-ray lens is set at the central position of the X-ray optical axis by the X-ray lens driving section 25.

Next, a secondary electron image 35 of the test sample 14 is obtained, an analyzed region of the secondary electron image 35 is selected, and the analysis is started (S106). The secondary electron image 35 is displayed at an image display section 32 and the analyzed region is adapted for point analysis, line analysis, and image entire region analysis. Here, the secondary electron image 35 is used, but in a case where the electron beam analyzer 4a shown in FIG. 11 is used, a transmitted-scattered electron image 44 may be used independently from the secondary electron image 35.

Next, an element spectrum 36 of the analyzed section is displayed at a spectrum display section 33 or displayed on an element map image 37 (S107).

Next, in a case where another element is to be analyzed, the processing returns to the operation of S105 to select another element. When another element has been selected, as is the case with the above, the condition stored in S102 is read out, the multi-capillary X-ray lens and the diffraction grating corresponding to the target element are selected, and the multi-capillary X-ray lens is set at the central position of the X-ray optical axis.

Next, a section desired to be analyzed is selected to start the analysis as in S106, and analysis results (element spectrum or element map) are displayed as in S107. A series of the operations from S105 to S107 described above is sequentially repeated until target element analysis is performed. In a case where there is no sample to be evaluated after end of the target element analysis, the sample 14 is carried out from the electron beam analyzer 4 (S108), ending the measurement (S109).

In a case where there is any other sample to be evaluated, after the already evaluated sample is carried out (S108), another test sample 14 is carried into the analyzer again (S104), and the operations of S105 to S107 are repeatedly performed to perform analysis of one or plural kinds of target elements. In a case where there is no target element analysis and no sample to be evaluated, the evaluated sample is carried out (S108), ending the measurement (S109).

In the series of analysis described above, the multi-capillary X-ray lens and the diffraction grating corresponding to each element is selected and set by the storage section 43, thus making it possible to perform automatic highly-sensitive analysis.

Taking the steps described above permits use of different combinations of the multi-capillary X-ray lens and the diffraction grating respectively in accordance with X-rays with different energies and makes it possible to provide X-ray intensity with a high yield. Moreover, as is the case with the first embodiment, the air opening following the lens replacement operation, the lens replacement operation, and the re-vacuuming are no longer required. Further, as described in this embodiment, a contaminated component resulting from the air opening no longer adheres, making it possible to perform detection of an element with trace concentration in a short term.

As described above, this embodiment can provide an X-ray analysis method capable of analysis with a high yield and high sensitivity in a micro region without depending on the energy of the X-ray.

The invention made by the inventor has been described in detail above based on the embodiments, but the invention is not limited to the embodiments described above and thus it is needless to say that various modifications can be made thereto within a range not departing from the spirits of the invention.

An analytical electronic microscopic device and an analysis method according to the present invention are technology useful for device failure analysis, but are not limited thereto and thus are widely applicable as technology of analyzing with high sensitivity an element with trace concentration in new material development.

What is claimed is:
1. A charged particle beam analyzer irradiating a charged particle beam to a sample in a vacuum container and detecting an X-ray generated from the sample to analyze the sample,
   wherein two or more multi-capillary X-ray lenses configured in different manners are provided in the vacuum container,
   wherein the charged particle beam analyzer further comprising;

a plurality of diffraction gratings dividing the X-ray generated from the sample, a section making selection from the two or more multi-capillary X-ray lenses and from the plurality of diffraction gratings to set the selected X-ray lens and the selection diffraction grating in accordance with an energy of the X-ray, and wherein a detector detecting the X-ray is a wavelength dispersive X-ray detector.

2. The charged particle beam analyzer according to claim 1, further comprising:

an X-ray lens holding section for holding the two or more multi-capillary X-ray lenses; and an X-ray lens replacement section replacing one of the two or more multi-capillary X-ray lenses with another one thereof by rotating the X-ray lens holding section, wherein the X-ray lens holding section and the X-ray lens replacement section are structured integrally.

3. The charged particle beam analyzer according to claim 1, further comprising:

an X-ray lens holding section for holding the two or more multi-capillary X-ray lenses; and an X-ray lens replacement section replacing one of the two or more multi-capillary X-ray lenses with another one thereof, wherein the X-ray lens holding section and the X-ray lens replacement section are structured separately from each other.

4. The charged particle beam analyzer according to claim 1, wherein the multi-capillary X-ray lenses have mutually different shapes.

5. The charged particle beam analyzer according to claim 4, wherein the multi-capillary X-ray lenses have mutually different tapered angles.

6. The charged particle beam analyzer according to claim 1, wherein the multi-capillary X-ray lenses are formed of materials with mutually different densities.

7. The charged particle beam analyzer according to claim 1, including a plurality of diffraction gratings dividing the X-ray generated from the sample, wherein the plurality of diffraction gratings are configured in different manners.

8. The charged particle beam analyzer according to claim 7, wherein the diffraction gratings have mutually different grating intervals.

9. The charged particle beam analyzer according to claim 8, wherein the diffraction gratings are formed of mutually different materials.

10. The charged particle beam analyzer according to claim 1, further comprising a plurality of diffraction gratings dividing the X-ray generated from the sample, wherein where the number of the multi-capillary X-ray lenses is M and the number of the diffraction gratings is N, N≧M.

11. A charged particle radiation analysis method of irradiating a charged particle beam to a sample in a vacuum container and detecting an X-ray generated from the sample to analyze the sample, wherein two or more multi-capillary X-ray lenses configured in different manners and a plurality of diffraction gratings dividing the X-ray are included in the vacuum container, and the analysis is performed through a combination of the multi-capillary X-ray lens and the diffraction grating in accordance with an energy of the X-ray.

\* \* \* \* \*